(12) United States Patent
Ghandi et al.

(10) Patent No.: US 8,569,167 B2
(45) Date of Patent: Oct. 29, 2013

(54) METHODS FOR FORMING A SEMICONDUCTOR STRUCTURE

(75) Inventors: Jaspreet S. Ghandi, Boise, ID (US); Don L. Yates, Boise, ID (US); Yangyang Sun, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 200 days.

(21) Appl. No.: 13/074,852

(22) Filed: Mar. 29, 2011

(65) Prior Publication Data
US 2012/0248614 A1 Oct. 4, 2012

(51) Int. Cl.
*H01L 21/4763* (2006.01)

(52) U.S. Cl.
USPC .......... 438/640; 438/612; 438/613; 438/638; 438/795; 438/799; 257/E21.578

(58) Field of Classification Search
USPC ......... 438/638, 640, 612, 613, 666, 795, 799, 438/E21.578
See application file for complete search history.

(56) References Cited

U.S. PATENT DOCUMENTS

| | | | |
|---|---|---|---|
| 5,391,516 A * | 2/1995 | Wojnarowski et al. | 438/612 |
| 6,851,803 B2 * | 2/2005 | Wooley et al. | 351/159.09 |
| 6,974,776 B2 | 12/2005 | Dean et al. | |
| 7,052,922 B2 | 5/2006 | Lindgren | |
| 7,629,250 B2 * | 12/2009 | Benson et al. | 438/637 |
| 7,732,319 B2 | 6/2010 | Jeong et al. | |
| 7,785,113 B2 | 8/2010 | Mizoguchi | |
| 2003/0153196 A1 * | 8/2003 | Tzeng et al. | 438/724 |
| 2004/0191956 A1 * | 9/2004 | Shimoaka | 438/108 |
| 2006/0116000 A1 * | 6/2006 | Yamamoto | 438/795 |
| 2007/0066048 A1 * | 3/2007 | Benson et al. | 438/620 |
| 2011/0308849 A1 * | 12/2011 | Kondo et al. | 174/260 |

* cited by examiner

*Primary Examiner* — Nitin Parekh
(74) *Attorney, Agent, or Firm* — TraskBritt

(57) ABSTRACT

Methods of forming a Ni material on a bond pad are disclosed. The methods include forming a dielectric material over a bond pad, forming an opening within the dielectric material to expose the bond pad, curing the dielectric material to form a surface of the dielectric material having a steep curvilinear profile, and forming a nickel material over the at least one bond pad. The dielectric material having a steep curvilinear profile may be formed by altering at least one of a curing process of the dielectric material and a thickness of the dielectric material. The dielectric material may be used to form a relatively thick Ni material on bond pads smaller than about 50 μm. Semiconductor structures formed by such methods are also disclosed.

18 Claims, 6 Drawing Sheets

METHODS FOR FORMING A SEMICONDUCTOR STRUCTURE

TECHNICAL FIELD

Embodiments of the present disclosure relate generally to semiconductor device fabrication. More particularly, the present disclosure relates to methods of electroless plating a nickel material on conductive elements having small features.

BACKGROUND

Interconnection and packaging-related issues are among the factors that determine not only the number of circuits that can be integrated on a chip but also the performance of the chip. These issues have gained importance as advances in chip design have led to reduced sizes of transistors and enhanced chip complexity. The industry has come to realize that merely having a fast chip will not necessarily result in a fast system; the fast chip must also be supported by equally fast and reliable connections. Essentially, the connections, in conjunction with the packaging, supply the chip with signals and power and redistribute the tightly packed terminals of the chip to the terminals of a carrier substrate and then to a circuit board.

One example of such an integrated circuit device is known as a "flip-chip." Flip-chip attachment generally includes electrically and mechanically attaching a semiconductor die by its active surface to an interposer substrate or other carrier substrate using an array of discrete conductive elements formed on the semiconductor die. The discrete conductive elements are formed and bonded to bond pads on the active surface of the semiconductor die, usually during fabrication of the semiconductor die along with a large number of others in wafer form, after which the wafer is singulated into the individual semiconductor die.

The discrete conductive elements usually are configured as minute conductive bumps or balls, but also may include studs, pillars or columns of various configurations. The conductive bumps or discrete conductive elements are typically, in the case of solder balls, attached to the bond pads by first forming an under bump metal (UBM) compatible with the material of the bond pads, as well as the solder balls. The UBM for solder balls to be placed on copper bond pads commonly includes nickel (Ni) and a thin layer of gold (Au). There can also be an intermediate palladium (Pd) layer in between the Ni and the Au forming an electroless nickel palladium immersion gold (ENEPIG). A thin layer of gold (Au) may also be formed over the copper bond pads. The Ni of the UBM may be formed by an electroless plating process. A preformed solder ball (for example, 60% Sn and 40% Pb) may then be provided on the UBM and heated to a predetermined reflow temperature so as to bond the solder balls to the UBM structures on the wafer. Alternatively, a solder paste may be disposed on the UBM and then heated to liquify and form a solder ball.

As the size of the bond pad decreases, it becomes increasingly difficult to form the Ni material of the UBM by using a conventional electroless plating process. For example, when using conventional electroless plating techniques on a bond pad having a cross-sectional dimension of less than about fifty micrometers (50 μm), it may not be possible to form a Ni material having a thickness greater than a few monolayers. Accordingly, methods of electrolessly plating Ni material on bond pads are desired.

DETAILED DESCRIPTION OF THE INVENTION

Methods of nickel plating a conductive feature (e.g., a bond pad, a metal layer, an interconnect cap, or a redistribution layer) on a semiconductor structure and semiconductor structures formed using such methods are disclosed. The methods include forming a dielectric material over the conductive feature, such as the bond pad. The conductive feature may be formed from a copper material. After curing, the dielectric material at least partially surrounds the bond pad, with a surface of the dielectric material adjacent the bond pad having a steep curvilinear profile. As used herein, the phrase "steep curvilinear profile" refers to a substantially curved surface of the dielectric material. An angle formed by a line drawn tangent to the curvilinear surface of the dielectric material and an exposed surface of the adjacent bond pad may be less than about 90° and greater than about 30°. The surface of the dielectric material may be substantially non-vertical and substantially non-horizontal, and have substantially curved or rounded portions thereof. The steep curvilinear profile of the dielectric material may increase a diffusion path of a stabilizer in an electroless nickel-plating solution, enabling nickel ions of the electroless nickel-plating solution to form on the bond pad. A nickel material may be formed over the bond pad using an electroless plating process.

The term "bond pad" as used herein includes and encompasses all suitable terminal structures to which an interconnection may be made, including both elevated and recessed bond pads as well as flat, concave or convex bond pads and other terminal structures. As used herein, the term "copper material" includes not only elemental copper, but also copper in combination with other trace metals or in various alloyed combinations with other metals as known in the semiconductor art, as long as such copper material is conductive. The copper may account for substantially all of the copper material or may account for a minor portion of the copper material, as long as the copper material is conductive.

Figure 1:
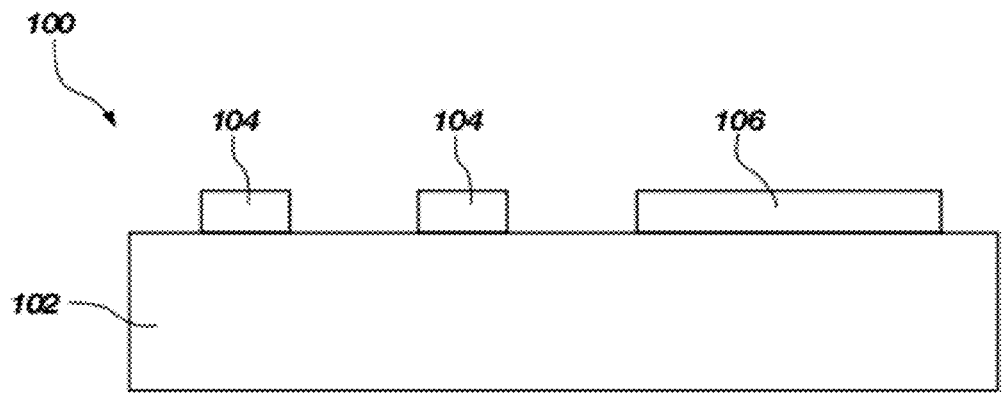
FIGS. 1 through 7 are cross-sectional views illustrating a method for forming an at least one conductive bump over a nickel material plated bond pad utilizing embodiments of the present disclosure.
Figure 7:
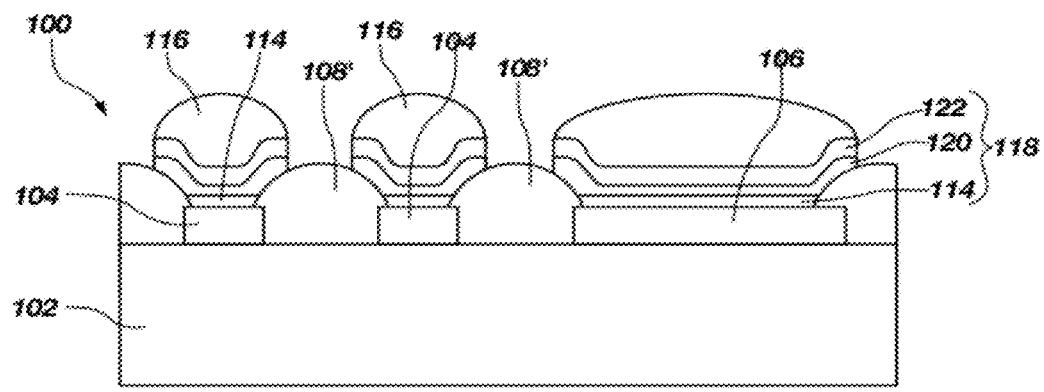

Intermediate structure 100 of FIG. 1 includes a substrate 102 having at least one bond pad 104, 106 formed thereon. As used herein, the phrase "at least one bond pad" collectively refers to at least one bond pad 104 and at least one bond pad 106, while the phrase "at least one small bond pad" is used to refer to at least one bond pad 104 and the phrase "at least one large bond pad" is used to refer to at least one bond pad 106, which has relatively larger dimensions than small bond pad 104. The substrate 102 may be a conventional silicon substrate or other bulk substrate including a layer of semiconductor material. As used herein, the term "bulk substrate" includes not only silicon wafers, but also silicon-on-insulator (SOI) substrates, silicon-on-sapphire (SOS) substrates, epitaxial layers of silicon on a base semiconductor foundation, and other semiconductor or optoelectronics materials, such as silicon-germanium, germanium, gallium arsenide, or indium phosphide. The material of the substrate 102 may be doped or undoped. In addition, the substrate 102 may include at least one feature (not shown), such as a memory device or integrated circuit, formed on or in the substrate 102 to which the at least one bond pad 104, 106 is electrically connected. In some embodiments, a redistribution layer (RDL) (not shown) may be in electrical communication with the at least one bond pad 104, 106, as known in the art, to provide alternate contact locations for at least one conductive bump 116 (FIG. 7). In additional embodiments, at least one of the at least one bond pad 104, 106 may be substituted with a terminal end of a through silicon via (TSV) interconnect.

The at least one bond pad 104, 106 may include a copper material. By way of example, the at least one bond pad 104, 106 may be formed of elemental copper, a copper alloy, or a combination of copper with another metal. The at least one bond pad 104 may be formed at any suitable thickness, for example, from about 500 Å to about 15,000 Å. At least one of the at least one bond pad 104, 106 may have a cross-sectional dimension of less than about 50 μm, such as the at least one small bond pad 104 shown in FIG. 1. In some embodiments, at least one large bond pad 106 may also be formed on the substrate 102. The large bond pad 106 may have a cross-sectional dimension greater than or equal to about 100 μm. In one embodiment, the at least one small bond pad 104 may have a cross-sectional dimension of about 30 μm and the at least one large bond pad 106 may have a cross-sectional dimension of about 100 μm. While FIG. 1 is illustrated as having two small bond pads 104 and one large bond pad 106, any number of small bond pads 104 and large bond pads 106 may be formed on the substrate 102. Additionally, embodiments of the present disclosure may be used on a substrate 102 including only small bond pads 104 or only large bond pads 106. The at least one bond pad 104, 106 may be formed by conventional semiconductor fabrication techniques, which are, therefore, not described in detail herein.

Figure 2:
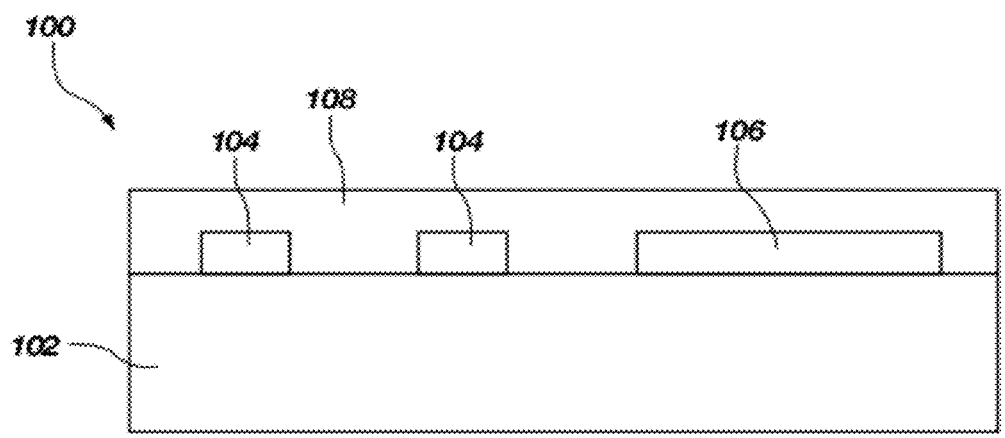

As shown in FIG. 2, a dielectric material 108 may be formed over the substrate 102 and the at least one bond pad 104, 106. The dielectric material 108 may be a photosensitive material such as, for example, for example, an epoxy, a polyimide, or a polybenzoxazole. In one embodiment, the dielectric material 108 is an epoxy material known as JSR ELPAC® WPR-5070 available from JSR Corporation of Higashi-Shinbashi, Minato-Ku, and Tokyo. In another embodiment, the dielectric material 108 is a polyimide, such as positive tone polyimide. The dielectric material 108 may be formed over the substrate 102 by conventional techniques, which are, therefore, not described in detail herein. In addition to being photosensitive, the dielectric material 108 may have a glass transition temperature ($T_g$) of from about 50° C. to about 250° C.

Figure 3:
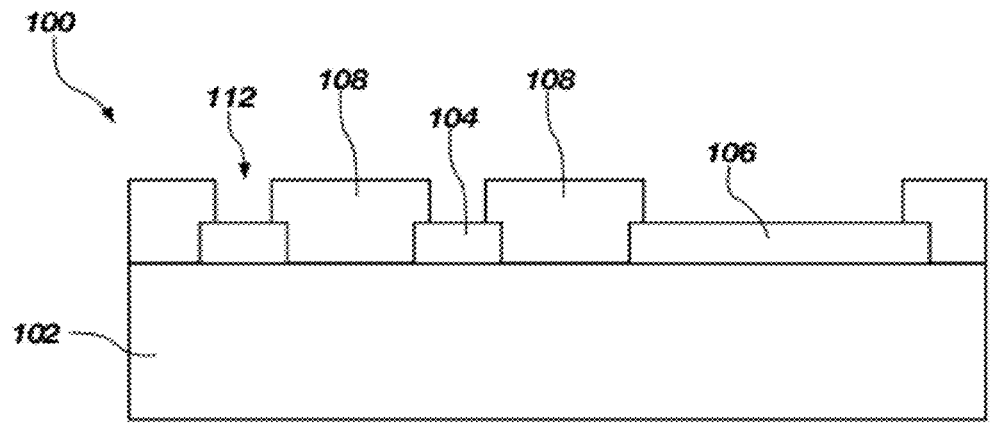

As shown in FIG. 3, the dielectric material 108 may be patterned, as known in the art, to form at least one opening 112 through the dielectric material 108 and expose at least a portion of the at least one bond pad 104, 106 through the dielectric material 108. A top surface of the at least one bond pad 104, 106 may be exposed through the openings 112, while sidewalls of the at least one bond pad 104, 106 may remain covered by the dielectric material 108. To form the openings 112 conventional methods including masking, exposing, and developing processes may be used. Briefly, for example, a reticle or mask (not shown) may be placed over the dielectric material 108. The reticle or mask may have openings or bright fields aligned with a desired location of the opening 112. Radiation, such as light, may be passed through the openings or bright fields in the reticle or mask and reach portions of the dielectric material 108 underlying such locations in the mask or reticle. The portions of the dielectric material 108 exposed to the radiation may be removed, forming openings 112. As shown in FIG. 3, sidewalls of the dielectric material 108 may be substantially vertical while an exposed top surface of the dielectric material 108 may be substantially planar.

Figure 4:
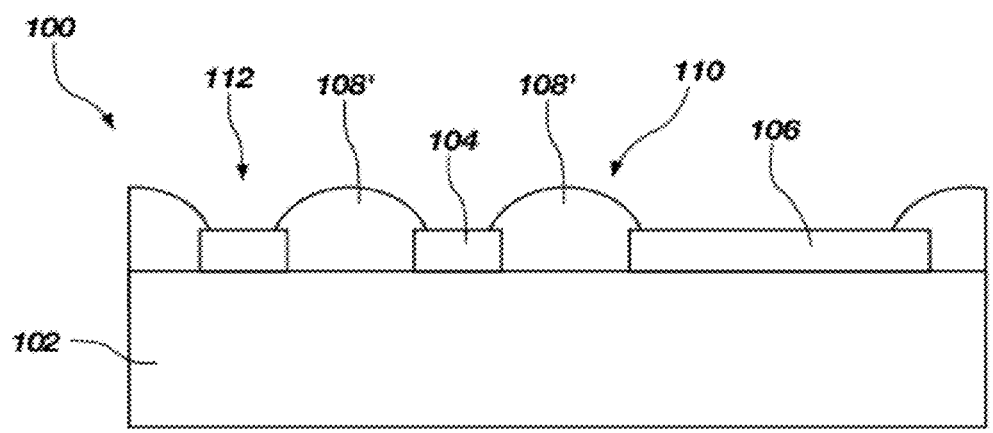

Once at least a portion of the at least one bond pad 104, 106 has been exposed through the dielectric material 108, the dielectric material 108 may be heated (e.g., cured) to form cured dielectric material 108' as shown in FIG. 4. The heat may cause a surface 110 of the dielectric material 108 to exhibit a steep curvilinear profile. The surface 110 of the cured dielectric material 108' may be substantially rounded in contrast to the substantially vertical sidewalls and substantially planar horizontal surface of the dielectric material 108 illustrated in FIG. 3. The cured dielectric material 108' adjacent the at least one bond pad 104, 106 may exhibit a hemispherical cross-section. The steep curvilinear profile of the cured dielectric material 108' may be achieved by controlling at least one of the thickness of the dielectric material 108, as formed, and the time and temperature for heating the dielectric material 108. The thickness of the cured dielectric material 108' may be greater than or equal to about two times a desired thickness of a Ni material 114 (FIG. 6) to be formed on the at least one bond pad 104, 106. In some embodiments, the dielectric material 108 may be greater than or equal to about three times a desired thickness of the Ni material 114. In some embodiments, the dielectric material 108 has a thickness of at least about 10 μm. In one embodiment, the dielectric material 108 has a thickness of at least about 15 μm.

Varying the temperature and intervals of exposure time while initially heating the dielectric material 108 may enable formation of the steep curvilinear profile of the cured dielectric material 108'. The curing process of the dielectric material 108 may include exposing the dielectric material 108 to a first temperature for a first time period followed by exposing the dielectric material 108 to a second temperature for a second time period. The second temperature may be greater than the first temperature. The first temperature may be less than or equal to a glass transition temperature ($T_g$) of the dielectric material 108 and the second temperature may be greater than the glass transition temperature of the dielectric material 108. Without being bound by a particular theory, it is believed that heating the dielectric material 108 at the first temperature enables molecules on a surface of the dielectric material 108 to crosslink. This creates a change in stress forces between the surface of the dielectric material 108 and an interior of the dielectric material 108. The increased stress forces on the surface of the dielectric material 108 relative to the interior of the dielectric material 108 forms the desired curvilinear profile. By maximizing the difference in stress forces between the surface of the dielectric material 108 and the interior of the dielectric material 108, formation of the steep curvilinear profile of the cured dielectric material 108' may be achieved. In contrast, when curing the dielectric material 108 by a conventional cure process, the dielectric material 108 is heated to a temperature above the glass transition temperature of the dielectric material 108. This prevents the molecules of the surface of the dielectric material 108 from crosslinking, and the dielectric material 108, both inside and on the surface may become soft, forming a flat or gradually rounded profile. For example, for a dielectric material having a glass transition temperature of about 100° C., a conventional curing process may include heating the dielectric material at 150° C. (i.e., above the glass transition temperature) for one-half hour and then increasing the temperature to 200° C. for another two hours. The resultant cured dielectric material may have a relatively flat or gradually curved surface. Conversely, the curing process of the present disclosure may include heating the dielectric material 108 at a temperature of less than or equal to about 100° C. (i.e., the glass transition temperature of the dielectric material 108) for at least one hour and then increasing the temperature to about 200° C. for another two hours. The resultant cured dielectric material 108' has the steep curvilinear profile as illustrated in FIG. 4.

Figure 5:
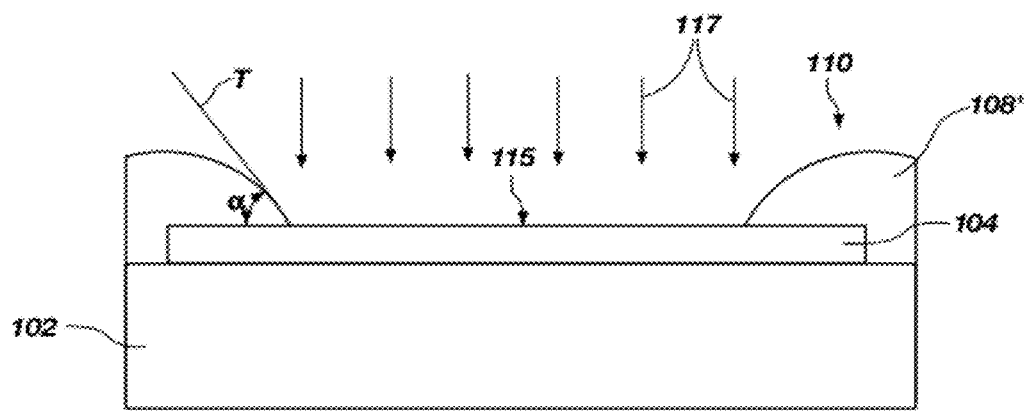

FIG. 5 illustrates an enlarged view of one of the small bond pads 104 surrounded by the cured dielectric material 108'. As shown in FIG. 5, a line T drawn tangent to surface 110 of the cured dielectric material 108' may form an angle α between the line T and horizontal surface 115 of the small bond pad 104. The angle α may be greater than about 30° and less than about 90°. In one embodiment, the angle α is about 35°. In another embodiment, the angle α may be at least about 55°.

Figure 6:
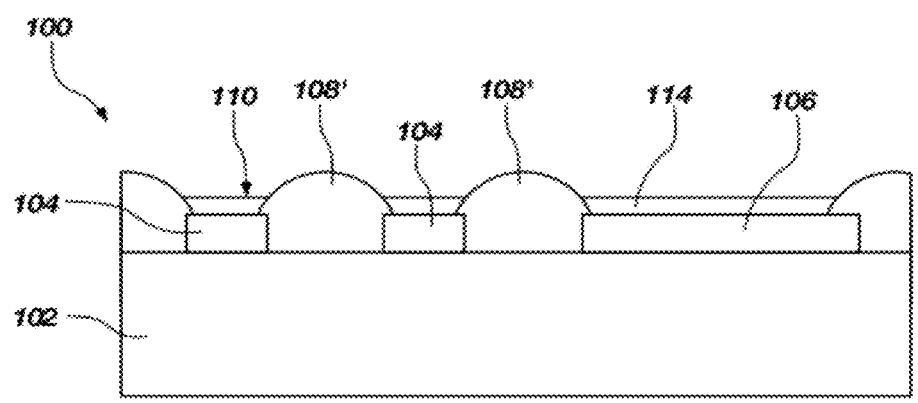

As shown in FIG. 6, once the cured dielectric material 108' has been cured, a Ni material 114 may be formed over the at least one bond pad 104, 106. The Ni material 114 may be formed using an electroless plating process. Such electroless plating processes are known in the art and are, therefore, not described in detail herein. Briefly, for example, the surface 115 of the at least one bond pad 104, 106 may be exposed to an activator (not shown) such as palladium, cobalt, or ruthenium. The semiconductor structure 100 may then be immersed in a bath containing an electroless nickel-plating solution to form the Ni material 114. Electroless Ni plating solutions are known in the art, such as electroless nickel-phosphorous plating solutions or electroless nickel-boron plating solutions. Such electroless nickel plating solutions are commercially available, such as NicPac 2.1, NicPac 2.2, and NicPac 2.3, which are available from PacTech GmbH (Berlin, Germany) and RONAMAX® SMT, DURAPOSIT®, NIPOSIT®, and Niplate™, which are available from Rohm and Haas Electronic Materials (Philadelphia, PA.). The electroless nickel-plating solution may include nickel ions, reducing agents, complexing agents, accelerators, and stabilizers. The concentration of the stabilizer may control the plating reaction so that the Ni material 114 is deposited on the at least one bond pad 104, 106 at a predictable rate and on desired surfaces. The concentration of stabilizer may also control the rate of growth of the Ni material 114 so that the Ni material 114 is grown as a flat surface. The stabilizers may include compounds of group VI elements, compounds containing oxygen, heavy metal cations, and unsaturated organic acids. During electroless plating, the nickel ions are reduced to nickel by oxidation of the reducing agent, forming the Ni material 114.

If the stabilizer in the electroless plating solution forms on the at least one bond pad 104, 106, the growth of the Ni material 114 on the at least one bond pad 104, 106 may be prohibited. This phenomenon may be especially prevalent when the bond pads 104, 106 have a cross-sectional dimension smaller than about 50 µm, such as the small bond pads 104. Without being bound by any particular theory, it is believed that the steep curvilinear profile of the surface 110 of the cured dielectric material 108' may help to prevent the stabilizer from depositing on the at least one bond pad 104, 106 thereby allowing for a thicker Ni material 114 to form thereon. The steep curvilinear profile of the cured dielectric material 108' may enable a thicker Ni material 114 to be formed by increasing the stabilizer diffusion path. The stabilizer would have to travel through the path shown by arrows 117 in FIG. 5 to reach the small bond pad 104. The activated copper surface is catalytic to electroless Ni reduction. The path shown by arrows 117 may be substantially linear. However, the electroless Ni reduction is a forced reaction and is dependent upon electrons supplied by a hypophosphite agent. A competing reaction exists between the stabilizer, which acts as a catalytic poison, and the Ni reduction reaction. By changing the dielectric material 108 profile to a steep curvilinear profile, the stabilizer diffusion path to the bond pads 104, 106 is increased, thereby favoring the Ni reduction reaction over the stabilizer's catalytic poisoning effect.

In addition, when a large bond pad 106 and a small bond pad 104 are formed on the same semiconductor structure, such as the semiconductor structure 100, the large bond pad 106 may attract a larger quantity of Ni ions than the small bond pads 104 due to a larger potential of the large bond pad 106. In other words, the large bond pad 106 may draw Ni ions away from the small bond pads 104 and to the large bond pad 106. This may result in a greater thickness of the Ni material 114 forming on the larger bond pads 106 than on the small bond pads 104. However, the steep curvilinear profile of the surface 110 of the cured dielectric material 108' may help to maintain a more uniform distribution of the Ni ions within the electroless plating solution. For example, Ni ions within an at least one opening 112 over one of the small bond pads 104 may be less likely to be drawn to the potential of the large bond pad 106 because of the cured dielectric material 108' impeding the path of the Ni ions between the small bond pad 104 and the large bond pad 106.

Referring still to FIG. 6, the Ni material 114 formed on the at least one bond pad 104, 106 may have a thickness configured to prevent oxidation of the at least one bond pad 104, 106 and provide good electrical contact between the at least one bond pad 104, 106 and a conductive bump 116 (FIG. 7). In some embodiments, the thickness of the Ni material 114 may be at least about 1 µm. In some embodiments, the Ni material 114 may have a thickness of at least about 4 µm.

As shown in FIG. 7, additional metal materials may be formed over the Ni material 114 to complete the formation of a UBM 118. For example, the UBM 118 may also include at least one of a palladium material 120 and a gold material 122 formed over the Ni material 114, as known in the art. The conductive bump 116 may then be formed over the UBM 118.

Figure 8:
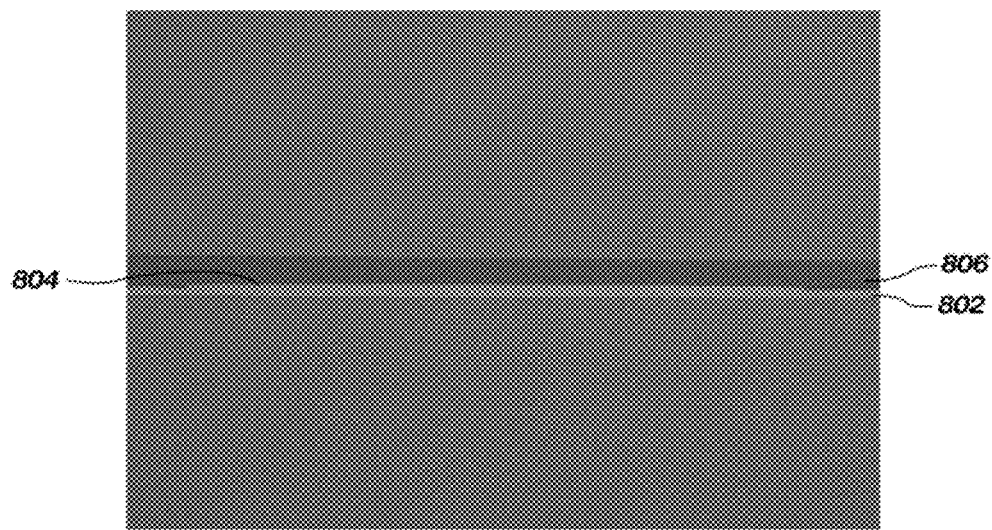
FIGS. 8 through 11 are electron microscopic photographs of a nickel material plated bond pad formed according to methods of embodiments of the present disclosure (FIGS. 9-11) as compared to a comparative example (FIG. 8).

FIGS. 8 through 11 are electron microscopic photographs of nickel-plated copper bond pads. Each of the nickel-plated copper bond pads of FIGS. 8 through 11 was formed using a dielectric material as described above. The dielectric material was an epoxy material having a glass transition temperature of about 100° C. available commercially as JSR ELPAC® WPR-5070. FIG. 8 shows a copper bond pad 802 plated with a Ni material 804 formed using a dielectric material 806 having a thickness of about 5 µm. The dielectric material 806 was formed over the copper bond pad 802 and heated using a first cure process, which included heating the dielectric material 806 to 150° C. for about one-half hour and then increasing the temperature to about 200° C. for about 2 hours. The Ni material 804 had a thickness of less than about 1 µm. The results described and shown in FIG. 8 function as a comparative example for the results described and shown in regard to FIGS. 9-11.

Figure 9:
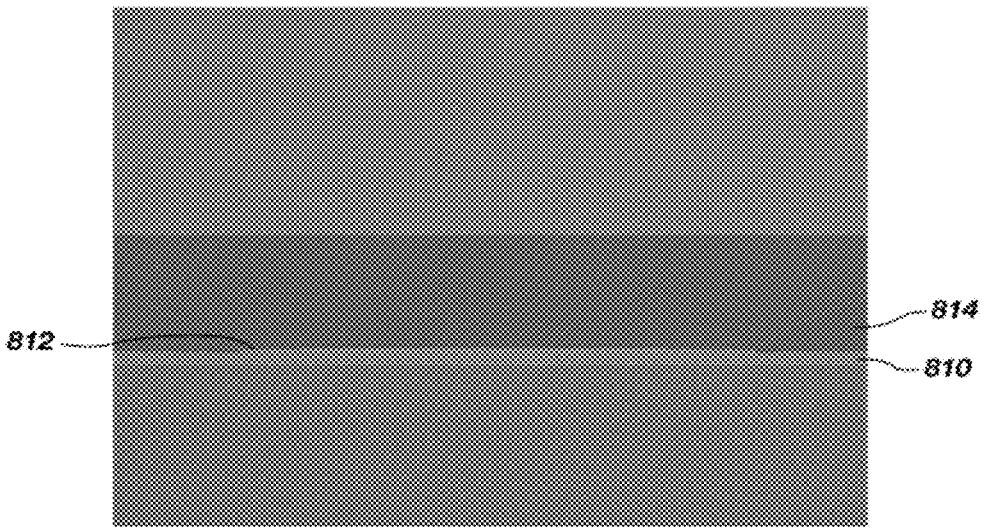

FIG. 9 shows a copper bond pad 810 plated with a Ni material 812 formed using a dielectric material 814 having a thickness of about 15 µm. The dielectric material 814 was formed using the first cure process as described above. The Ni material 812 had a thickness of greater than about 1 µm. Although not shown in FIG. 9, in some locations the Ni material 812 had a thickness of greater than about 4 µm. Comparing the thickness (greater than about 4 µm) of Ni material 812 in these locations to the thickness (less than about 1 µm) of Ni material 804 shows that by increasing the as-deposited thickness of the dielectric material 814, the thickness of the Ni material 812 formed over the copper bond pad 810 was increased, although inconsistently.

Figure 10:
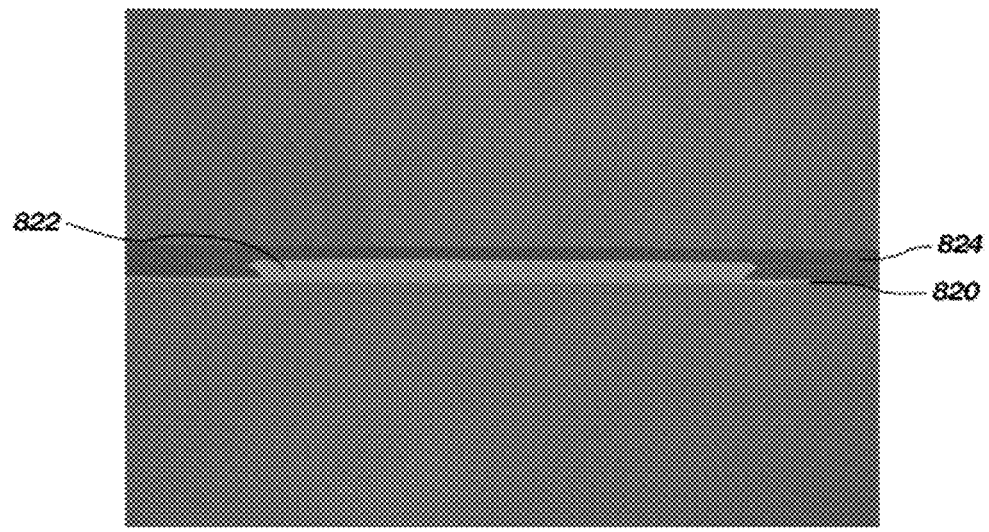

FIG. 10 shows a copper bond pad 820 plated with a Ni material 822 formed using a dielectric material 824 having a thickness of about 5 μm. The dielectric material 824 was formed over the copper bond pad 820 and heated using a second cure process. The second cure process included heating the dielectric material 824 to a first temperature of about 100° C. for about one hour and then increasing the temperature to about 200° C. for about 2 hours. The Ni material 822 had a thickness of at least about 4 μm. Comparing the thickness (at least about 4 μm) of Ni material 822 to the thickness (less than about 1 μm) of Ni material 804 shows that by utilizing the second cure process, the thickness of the Ni material 822 formed over the copper bond pad 820 was increased.

Figure 11:
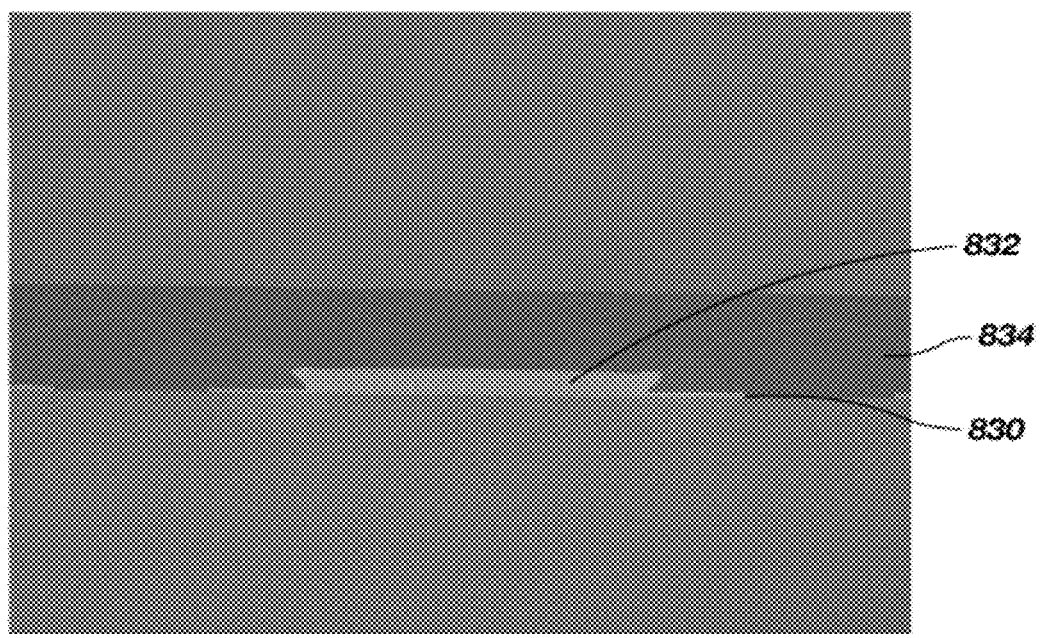

FIG. 11 shows an example of a copper bond pad 830 plated with a Ni material 832 formed using a dielectric material 834 having a thickness of about 15 μm. The dielectric material 834 was formed using the second cure process as described above. The Ni material 832 has a thickness of at least about 4 μm. Comparing the thickness (at least about 4 μm) of Ni material 832 to the thickness (greater than about 1 μm) of Ni material 812 shows that by utilizing the second cure process, the thickness of the Ni material 832 formed over the copper bond pad 830 was increased, although inconsistently. However, when comparing the effect of the dielectric material thickness in tests that utilized the second cure process, no difference was observed between the thickness of Ni material 832 and the thickness of Ni material 822.

As shown by FIGS. 8 through 11, by using the second cure process, the thickness of the Ni material 822, 832 formed on the copper bond pad 820, 830 was, in some instances, larger than the thickness of the Ni material 804, 812 formed on copper bond pad 802, 810 using the first cure process. Accordingly, by first heating the dielectric material 824, 834 at 100° C., which corresponds to the glass transition temperature of the dielectric material 824, 834, a thicker Ni material 822, 832 may be formed than when the dielectric material 806, 814 is cured at 150° C., which is greater than the glass transition temperature of the dielectric material 806, 814. In addition, increasing the thickness of the dielectric material 814, 834 also increased the thickness of the Ni material 812, 832.

The present disclosure has been described in relation to particular embodiments that are intended in all respects to be illustrative rather than restrictive. It is to be understood that the invention defined by the appended claims and legal equivalents thereof is not to be limited by particular details set forth in the above description and that alternative embodiments will become apparent to those of ordinary skill in the art to which the present disclosure pertains without departing from the scope thereof.

CONCLUSION

In some embodiments, the present disclosure includes a method of forming a semiconductor structure, the method comprising forming a dielectric material over at least one bond pad. An opening is formed within the dielectric material to expose the at least one bond pad. The dielectric material is cured to form a surface of the dielectric material having a steep curvilinear profile. A nickel material is formed over the at least one bond pad.

In further embodiments, the present disclosure includes a method of forming a semiconductor structure. The method comprises forming a dielectric material over at least one bond pad, the dielectric material comprising a photosensitive polyimide material. A portion of the dielectric material is removed to expose at least a portion of the at least one bond pad. The dielectric material is heated to a first temperature less than or equal to a glass transition temperature of the dielectric material and the dielectric material is heated to a second temperature greater than the glass transition temperature of the dielectric material. A nickel material is plated on the at least one bond pad.

In additional embodiments, the present disclosure includes a semiconductor structure comprising at least one bond pad on a substrate, a dielectric material over the substrate, and a nickel material formed over the at least one bond pad. The dielectric material has an opening therethrough that exposes the at least one bond pad and a surface of the dielectric material has a curvilinear profile resulting from a curing process performed on the dielectric material, the curing process comprising heating the dielectric material to a temperature less than or equal to a glass transition temperature of the dielectric material.

What is claimed is:

1. A method of forming a semiconductor structure, the method comprising:
   forming a dielectric material over at least one bond pad;
   forming at least one opening within the dielectric material to expose the at least one bond pad;
   curing the dielectric material comprising the at least one opening, the curing forming a surface of the dielectric material having a steep curvilinear profile; and
   forming a nickel material over the at least one bond pad.

2. The method of claim 1, wherein curing the dielectric material comprising the at least one opening comprises:
   heating the dielectric material comprising the at least one opening to a first temperature less than or equal to a glass transition temperature of the dielectric material; and
   heating the dielectric material comprising the at least one opening to a second temperature greater than the glass transition temperature of the dielectric material.

3. The method of claim 2, wherein heating the dielectric material comprising the at least one opening to a first temperature less than or equal to a glass transition temperature of the dielectric material comprises heating the dielectric material comprising the at least one opening for about one hour.

4. The method of claim 2, wherein heating the dielectric material comprising the at least one opening to a second temperature greater than the glass transition temperature of the dielectric material comprises heating the dielectric material comprising the at least one opening for about two hours.

5. The method of claim 1, wherein forming a dielectric material over at least one bond pad comprises forming the dielectric material at least about 10 μm thick.

6. The method of claim 1, wherein forming a dielectric material over at least one bond pad comprises forming a positive tone polyimide over the at least one bond pad.

7. The method of claim 1, wherein forming a dielectric material over at least one bond pad comprises forming the dielectric material over the at least one bond pad having a cross-section dimension of less than about 50 μm.

8. The method of claim 1, wherein forming a nickel material over the at least one bond pad comprises forming the nickel material at least about 4 μm thick.

9. The method of claim 1, wherein forming a dielectric material over at least one bond pad comprises forming a photosensitive dielectric material having a glass transition temperature ($T_g$) of from about 50° C to about 250° C over the at least one bond pad.

10. The method of claim 1, wherein curing the dielectric material comprising the at least one opening, the curing forming a surface of the dielectric material having a steep curvilinear profile comprises changing sidewalls of the dielectric material from a substantially vertical profile to a substantially rounded profile.

11. The method of claim 1, wherein curing the dielectric material comprising the at least one opening, the curing forming a surface of the dielectric material having a steep curvilinear profile comprises forming the surface of the dielectric material having a hemispherical cross-section.

12. The method of claim 1, wherein curing the dielectric material comprising the at least one opening, the curing forming a surface of the dielectric material having a steep curvilinear profile comprises forming an angle of greater than about 30° and less than about 90° between a line tangent to a curvilinear surface of the dielectric material and an exposed surface of an adjacent bond pad.

13. A method of forming a semiconductor structure, the method comprising:
    forming a dielectric material over at least one bond pad, the dielectric material comprising a photosensitive polyimide material;
    removing at least one portion of the dielectric material to expose at least a portion of the at least one bond pad;
    heating the dielectric material to a first temperature after removing the at least one portion of the dielectric material, the first temperature less than or equal to a glass transition temperature of the dielectric material;
    heating the dielectric material to a second temperature after heating the dielectric material to the first temperature, the second temperature greater than the glass transition temperature of the dielectric material; and
    plating a nickel material on the at least one bond pad.

14. The method of claim 13, wherein removing at least one portion of the dielectric material to expose at least a portion of the at least one bond pad comprises exposing the at least one bond pad through openings in the dielectric material, the openings defined by substantially vertical sidewalls of the dielectric material.

15. The method of claim 13, wherein heating the dielectric material to a first temperature after removing the at least one portion of the dielectric material and heating the dielectric material to a second temperature after heating the dielectric material to the first temperature comprises forming a steep curvilinear profile in the dielectric material.

16. The method of claim 13, wherein forming a dielectric material over at least one bond pad comprises forming a dielectric material having a thickness of at least about two times a thickness of the nickel material.

17. The method of claim 13, wherein forming a dielectric material over at least one bond pad comprises forming at least two external bond pads, at least one of the external bond pads having a cross-sectional dimension less than about 50 µm and another of the at least one external bond pads having a cross-sectional dimension of greater than or equal to about 100 µm.

18. The method of claim 13, wherein heating the dielectric material to a first temperature after removing the at least one portion of the dielectric material comprises crosslinking only a surface of the dielectric material.

* * * * *

UNITED STATES PATENT AND TRADEMARK OFFICE
CERTIFICATE OF CORRECTION

| | | |
|---|---|---|
| PATENT NO. | : 8,569,167 B2 | |
| APPLICATION NO. | : 13/074852 | |
| DATED | : October 29, 2013 | |
| INVENTOR(S) | : Jaspreet S. Gandhi et al. | |

It is certified that error appears in the above-identified patent and that said Letters Patent is hereby corrected as shown below:

Title Page, in item (75), under "Inventors", in column 1, line 1, delete "Ghandi," and insert
-- Gandhi, --, therefor.

Signed and Sealed this
Twenty-eighth Day of January, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,569,167 B2  
APPLICATION NO. : 13/074852  
DATED : October 29, 2013  
INVENTOR(S) : Jaspreet S. Gandhi et al.

Page 1 of 1

It is certified that error appears in the above-identified patent and that said Letters Patent is hereby corrected as shown below:

Title page, item (12), delete "Ghandi" and insert -- Gandhi --.

Title page, item (75), under "Inventors", in column 1, line 1, delete "Ghandi," and insert -- Gandhi, --, therefor.

This certificate supersedes the Certificate of Correction issued January 28, 2014.

Signed and Sealed this  
Twenty-fifth Day of February, 2014

Michelle K. Lee  
*Deputy Director of the United States Patent and Trademark Office*